United States Patent [19]
Meyer

[11] Patent Number: 5,319,681
[45] Date of Patent: Jun. 7, 1994

[54] METHOD AND A DEVICE FOR SYNCHRONIZING A SIGNAL

[75] Inventor: Jacques Meyer, Corenc, France

[73] Assignee: SGS-Thomson Microelectronics s.a., Gentilly, France

[21] Appl. No.: 922,331

[22] Filed: Jul. 29, 1992

[30] Foreign Application Priority Data

Jul. 30, 1991 [FR] France ................ 91 09925

[51] Int. Cl.$^5$ .................................. H03D 3/24
[52] U.S. Cl. .......................... 375/119; 331/25; 328/72; 375/120
[58] Field of Search ................ 375/81, 119, 120; 331/1 A, 1 R, 18, 25; 328/63, 72

[56] References Cited

U.S. PATENT DOCUMENTS

| | | | |
|---|---|---|---|
| 4,715,050 | 12/1987 | Tanaka et al. | 375/120 |
| 4,748,644 | 5/1988 | Silver et al. | 375/120 |
| 4,841,167 | 6/1989 | Sargusa | 375/119 |
| 4,870,684 | 9/1989 | Arai et al. | 381/7 |
| 4,890,305 | 12/1989 | Devries | 375/120 |
| 5,077,529 | 12/1991 | Ghoshal et al. | 331/25 |

FOREIGN PATENT DOCUMENTS

0316878 5/1989 European Pat. Off. .
2453213 5/1976 Fed. Rep. of Germany .

OTHER PUBLICATIONS

John Snyder "Digital Phase-Locked Loop Finds Clock Signal in Bit Stream", Electronics Aug. 30, 1979 vol. 52, No. 18.

Primary Examiner—Stephen Chin
Attorney, Agent, or Firm—Seed and Berry

[57] ABSTRACT

A device synchronizes an internal signal with respect to a reference signal, each signal comprising pulses normally occurring at a rated frequency. The device uses a phase comparator to analyze the phase of the internal signal and the reference signal and produce one logic state if the phase of the internal signal is in advance of the phase of the reference signal and a second logic state otherwise. A programmable frequency divider divides an internal clock signal by a first number if the phase comparator signal produces the first logic state or by a second number if the phase comparator produces the second logic state. A multiplexer provides the programmable divider with either the first number or the second number depending on the logic state produced the phase comparator. The device also includes a storage element for sequentially storing a predetermined number of the latest logic states of the phase comparator. The device also includes circuitry for decrementing the first number when the latest stored logic states of the phase comparator have a single occurrence of the first logic state and for incrementing the second number when the latest stored logic states of the phase comparator have a single occurrence of the second state.

22 Claims, 3 Drawing Sheets

METHOD AND A DEVICE FOR SYNCHRONIZING A SIGNAL

TECHNICAL FIELD

The present invention relates to phase locked loops (PLL) and particularly to a digital PLL.

BACKGROUND OF THE INVENTION

A PLL is a device providing a signal synchronized with respect to a reference signal, that is, having the same phase and frequency as the reference signal. In the absence of a reference signal, the PLL provides a frequency approximately equal to the rated frequency of the reference signal. The function of the PLL is to follow the reference signal and to provide a signal similar to the reference signal in case of an accidental absence of the latter.

FIG. 1A shows a conventional simple digital PLL, intended to synchronize the pulses of an internal signal Fint with respect to the pulses of a reference signal SYNC. This PLL comprises a digital phase comparator (PHASE-COMP) 10 receiving signals Fint and SYNC and providing at its output a signal SGN. Signal SGN assumes a first logic state (1) if the phase of signal Fint is in advance to the phase of signal SYNC, i.e. if a pulse of signal Fint occurs prior to a pulse of signal SYNC, and assumes a second state (0) if signal Fint has a delayed phase. Signal Fint is obtained by dividing a clock signal CK through a divider (DIV $N_H - N_L$) 12 controlled by the signal SGN of the phase comparator. Divider 12 divides signal CK by a fixed high number $N_H$ when signal SGN is "1" and by a fixed low number $N_L$ when signal SGN is "0".

Number $N_H$ is such that the signal Fint obtained by dividing the clock signal CK by this number $N_H$ has a period higher than the rated period of the reference signal SYNC. Number $N_L$ is such that signal Fint has a period lower than the rated period of the reference signal SYNC.

FIG. 1B shows signals SYNC, Fint and SGN in an exemplary application of the PLL of Figure IA to TV signals, where signal Fint is used for generating the line scan. Signal SYNC is then generated by a receiving circuit or a magnetic tape recorder and its rated period is 64 microseconds.

Period T of signal SYNC, especially in the case of a video tape recorder where it is determined by the running speed of the tape, can vary within a substantially high range. Number $N_H$ is selected so that the corresponding signal Fint has a long period $T_H$ higher than the maximum period of signal SYNC, for example 65 microseconds. Number $N_L$ is selected so that the corresponding signal Fint has a short period $T_L$ lower than the minimum period, for example 63 microseconds.

FIG. 1B shows the signals obtained in steady state assuming that signal SYNC is at its rated period (64 microseconds).

At a time t0, a pulse from signal Fint is detected prior to a synchronization pulse from signal SYNC, which indicates that signal SYNC has a phase lag with respect to signal Fint. The signal SGN of the phase comparator goes to "1" and selects the division of the clock signal CK by the high number $N_H$. The next period of signal Fint is therefore fixed to 65 microseconds.

At a time t1, the next synchronization pulse of signal SYNC is detected before a pulse from signal Fint. This indicates that the signal Fint has a phase lag with respect to signal SYNC. Signal SGN goes to "0" and selects the division by the low number $N_L$ and therefore a 63-microsecond period of signal Fint.

At a time t2, a pulse from signal Fint is detected prior to the next synchronization pulse from signal SYNC, indicating a phase lag. Signal SGN switches to state "1" and the process is resumed in the same way as at time t0.

In the above case where the period T of the reference signal SYNC is constant and equal to the average value of the long and short periods of signal Fint, the period of signal Fint oscillates at each period between 63 and 65 microseconds.

If the period T is slightly higher than 64 microseconds, the period of signal Fint oscillates in the same way with, however, from time to time, a few successive periods of 65 microseconds. If the period T is slightly lower than 65 microseconds, signal Fint will have a period of 65 microseconds with, from time to time, a period of 63 microseconds. In fact, the long or short periods of signal Fint successively occur so that the average frequency calculated over a large number of periods of signal Fint is equal to that of signal SYNC. It can be demonstrated that the duty cycle of signal SGN is expressed by $(T - T_L)/(T_H - T_L)$.

If period T is higher than 65 microseconds, the period of signal Fint is blocked at 65 microseconds and is therefore false.

Complementary cases occur when period T ranges from 63 to 64 microseconds.

Thus, this PLL is capable of following a reference signal SYNC only if its period T ranges within determined limits (here, 63 and 65 microseconds). It is therefore advantageous to separate as much as possible the extreme limits of signal Fint in order to increase the tracking range.

However, by increasing this range, the resolution of the PLL is reduced. In fact, assuming that signal SYNC is the line scan synchronization signal of a TV set, the period jumps between the extreme periods of signal Fint, from which scanning is generated, appear in the form of lines on the screen alternatively beginning forward or backward one with respect to the other. If the extreme periods of signal Fint are too high, these line differences become visible and unpleasant (a vertical line will be indented).

SUMMARY OF THE INVENTION

An object of the invention is to provide a simple digital PLL with a large tracking range and a good resolution.

The invention is embodied in a method of synchronizing an internal signal to a reference signal by comparing the phase of the internal signal with the phase of the reference signal and producing a first logic state if the phase of the internal signal is in advance of the phase of the reference signal, or a second logic state otherwise. The internal signal is produced by dividing a clock signal by a first or a second variable divisor depending on the logic state of the phase comparison signal. The value of the variable divisors may be altered based on the value of successive states of the phase comparison signal.

Alternatively, this object is achieved with a method for synchronizing an internal signal with respect to a reference signal having a reference period, the internal signal having a long or short period between which the reference period is normally included, comprising the following steps:

a) analyzing the duration of the reference period with respect to the durations of the long and short periods;

b) if the reference period is closer to the long period than to the short period, incrementing the short period;

c) if the reference period is closer to the short period than to the long period, decrementing the long period:

d) if the reference period is higher than the long period, incrementing the long period; and e) if the reference period is smaller than the short period, decrementing the short period.

According to an embodiment of the invention, step a) consists in analyzing a predetermined number of the latest successive phase differences between the internal signal and the reference signal and the requirements of steps b) to e) are respectively met if:

the number of phases in advance is higher than the number of lagged phases;

the number of lagged phases is higher than the number of phases in advance;

there is no phase lag; and there is no phase advance.

According to an embodiment of the invention, if the number of the successive phases in advance is higher than a predetermined number, the long period is incremented; and, if the number of successive phase lags is higher than the predetermined number, the short period is decremented.

According to an embodiment of the invention, the following steps are achieved: comparing the long period with the short period and inhibiting the decrementation of the long period and the incrementation of the short period when the difference between these periods is lower than a predetermined threshold.

According to an embodiment of the invention, the following steps are provided: comparing the long period with a maximum period and inhibiting the incrementation of the long period if these periods are equal; and comparing the short period with a minimum period and inhibiting the decrementation of the short period if these periods are equal.

The invention is embodied in a device containing a phase comparator to measure the phase difference of the internal signal and the reference signal and producing a phase comparison signal. A programmable divider divides a clock signal by a first or second variable divisor depending on the logic state of the phase comparison signal. The value of the variable divisor may be altered depending on the value of successive logic states of the phase comparison signal.

Alternatively, the invention provides a device for synchronizing an internal signal with respect to a reference signal, these signals each comprising pulses normally occurring at a rated frequency, comprising a phase comparator providing a phase comparison signal at a predetermined logic state if the phase of the internal signal is in advance with respect to the phase of the synchronization signal, and to a complementary logic state otherwise; a programmable sequence divider receiving a clock signal and providing the internal signal; a multiplexer providing the divider, in order to program it, with a high binary number if the comparison signal is at a predetermined state, and a low binary number otherwise; means for sequentially storing the latest states of the comparison signal; first counting means clocked by the internal signal and providing the high binary number to the multiplexer; first detection means setting the first counting means to down-counting position when the latest stored states of the comparison signal have a single state at the predetermined state; second counting means clocked by the internal signal and providing the low binary number to the multiplexer; and second detection means setting the second counting means to up-counting position when the latest stored states of the comparison signal have a single state at the complementary state.

According to an embodiment of the invention, this device further comprises third detection means setting the first counting means to counting position when the stored states of the comparison signal are all set to the predetermined state; and fourth detection means setting the second counting means to down-counting position when the stored states of the comparison signal are all set to the complementary state.

According to an embodiment of the invention, this device further comprises a first comparator for comparing the high and low binary numbers and setting the first and second counting means to standby position if the high number is lower than or equal to the low number.

According to an embodiment of the invention, this device further comprises a second comparator for comparing the high binary number with the maximum binary number and setting the first counting means to the standby position if the maximum number is exceeded; and a third comparator for comparing the low binary number with a minimum number and setting the second counting means to the standby position if the minimum number is exceeded.

According to an embodiment of the invention, the programmable divider comprises a divider by two distinct numbers, either one is selected by the output signal of a pulse generator programmed by the number supplied by the multiplexer.

BRIEF DESCRIPTION OF THE DRAWINGS

The foregoing and other objects, features and advantages of the invention will be apparent from the following detailed description of preferred embodiments as illustrated in the accompanying figures wherein.

DETAILED DESCRIPTION OF THE INVENTION

Figure 1A:
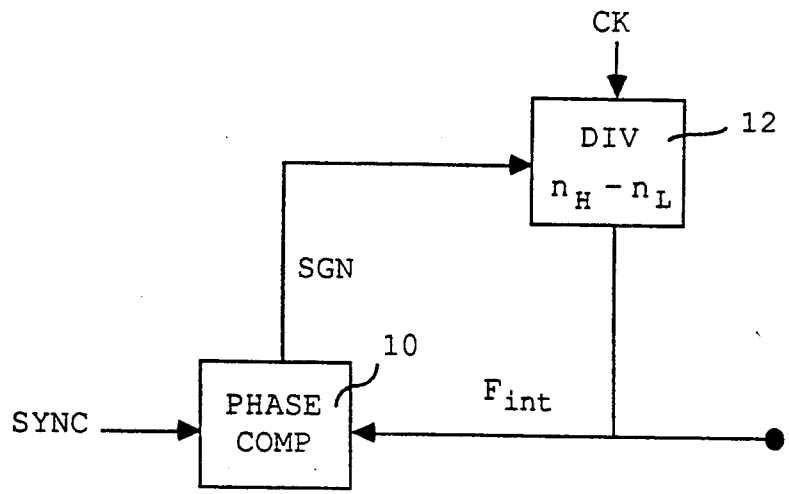
FIGS. 1A and 1B, above described, respectively show a conventional digital PLL and signals associated with this PLL.

In a synchronization system with a PLL as shown in FIG. 1A, the method according to the invention consists in modifying the long ($T_H$) and short ($T_L$) periods of signal Fint so as to bring them closer, as much as possible, to a current stable period T of signal SYNC while providing that the latter is between a long period and a short period. This is achieved as follows.

Following a shift of the frequency of signal SYNC, the period T of the latter is no longer included between the long and short periods of signal Fint. If period T is, for example, higher than the long period, this long period is incremented until it is again higher than period T. If period T is lower than the short period, the short period is decremented until it is again lower than period T. Then, the period of signal Fint the most remote from period T is brought nearer until the other period of signal Fint is the most remote, and so forth until the long and short periods are separated from each other by a predetermined minimum value while being on both sides of period T.

Figure 2:
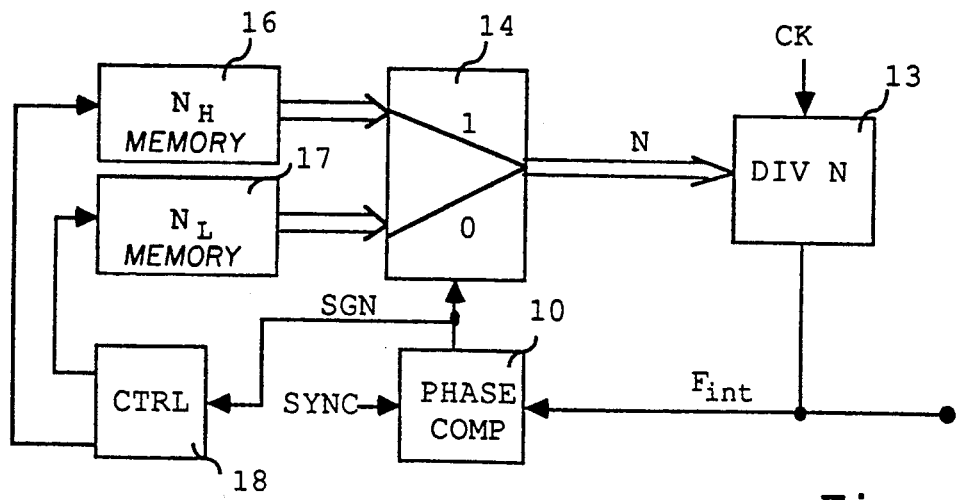
FIG. 2 is a simplified diagram of a digital PLL according to the invention.

FIG. 2 is a simplified drawing of a PLL according to an embodiment of the invention enabling this modification of long and short periods of signal Fint by adequately modifying the division numbers $N_H$ and $N_L$ of FIG. 1A. The PLL comprises a digital phase comparator 10 identical to the one used in the conventional PLL of FIG. 1A receiving signals SYNC and Fint and providing signal SGN. Signal Fint is obtained by dividing a clock signal CK by a programmable N divider (DIV N) 13. Divider 13 comprises a programmation input on which is presented number N. This number N is provided by the two-input multiplexer 14. State "1" of signal SGN selects the first input of multiplexer 14 on which is presented the high number $N_H$ stored in a memory 16. State "0" of signal SGN selects the second multiplexer input on which is presented the low number $N_L$ stored in a memory 17.

The above described components of the PLL according to the invention have the same functions as those of the conventional PLL of FIG. 1A and similarly provide a signal Fint with short periods $T_L$ and long periods $T_H$ occurring successively in such a way that the average period of signal Fint calculated over a large number of periods is equal to the period T of signal SYNC.

The conventional divider by $N_H$ or $N_L$ 12 is replaced with a programmable divider 13 to which is externally provided either number $N_H$ or $N_L$ through the multiplexer 14 switched by signal SGN. Thus, by modifying numbers $N_H$ and $N_L$, periods $T_H$ and $T_L$ are modified in the above described way. A method for modifying numbers $N_H$ and $N_L$ will be described in more detail hereafter, according to a preferred embodiment of the invention.

Figure 1B:
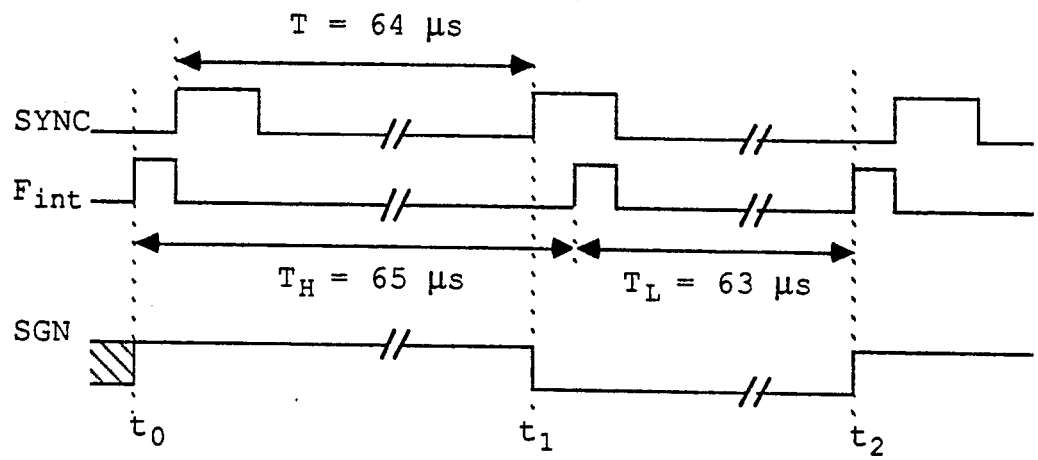

A control circuit (CTRL) 18 increments or decrements numbers $N_H$ and $N_L$ in memories 16 and 17 as a function of the sequences of states of signal SGN. Circuit 18 analyzes the latest successive states of signal SGN inside a window comprising a predetermined number of periods, for example 4. The interpretation of the states of signal SGN enables detecting the following cases and causing the corresponding operations.

a) Signal SGN presents states alternating between "1" and "0" its duty cycle is 0.5). As indicated in relation with FIG. 1B, the period T of signal SYNC is thus centered between the short periods $T_L$ and long periods $T_H$ of signal Fint. These half-periods of signal SGN are detected in the analysis window and the high number $N_H$ is decremented during every two periods while the low number $N_L$ is incremented during each of the other periods. Thus, one obtains a quick convergence of the long period $T_H$ and short period $T_L$ of signal Fint to period T of signal SYNC.

b) Signal SGN is continuously at "1" (the resulting signal Fint is blocked on the long period). This indicates that the long period $T_H$ of signal Fint is lower than the current period T of signal SYNC or at least insufficient for quickly recovering the phase delay. When signal SGN is, for example, during 4 periods to "1", the high number $N_H$ is incremented by one unit at each of the subsequent periods until signal SGN is detected at "0".

c) Signal SGN presents sequences of "1's" with one "0" from time to time (its duty cycle is close to 1). This indicates that the long period $T_H$ is higher than period T but closer to the latter than the short period $T_L$. Each time "0" is detected, the low number $N_L$ is incremented by one unit to bring the short period $T_L$ nearer to periods T and $T_H$. Thus, the number of successive "1's" decreases so that the average period of the resulting signal Fint remains equal to the period T, until alternate "1's" and "0's" appear.

However, in the case the number of "1's" is very high, the low number $N_L$ would be very slowly incremented. In order to accelerate the convergence, it is preferable to operate as follows. As in the case of b), the high number $N_H$ will be incremented for each period following the period when four successive "1's" are detected in the analysis window. This causes a quick centering of period T between the long period $T_H$ and short period $T_L$. Indeed, one obtains a modification of either numbers $N_H$ or $N_L$ during all the periods except for the four periods to "1" following a "0" of signal SGN. When period T is centered, one obtains the above case a) where convergence is quick.

Cases d) and e) here below correspond to the complementary cases of cases b) and c) and the same reasoning is valid.

d) Signal SGN is constantly at "0". This indicates that the short period $T_L$ is higher than the period T. When signal SGN has been during four periods to "0", the low number $N_L$ is decremented by one unit at each of the subsequent periods, until signal SGN is detected at "1".

e) Signal SGN presents successive sequences of "0's" with one "1" from time to time (its duty cycle close to 0). This indicates that the short period $T_L$ is lower than the period T but closer to the latter than the long period $T_H$. Each time "1" is detected, the high number $N_H$ is decremented by one unit. The low number $N_L$ is incremented for each subsequent period when four successive "0's" are detected in the analysis window, until alternate "1's" and "0's" appear.

Of course, the PLL according to the invention operates only if predetermined requirements are complied with. Especially, $N_H$ has to be higher than $N_L$; hence, it is necessary to avoid decrementing number $N_H$ or incrementing number $N_L$ when they differ only by one unit at step a). It will be seen in relation with FIG. 3 how these requirements are met.

Figure 3:
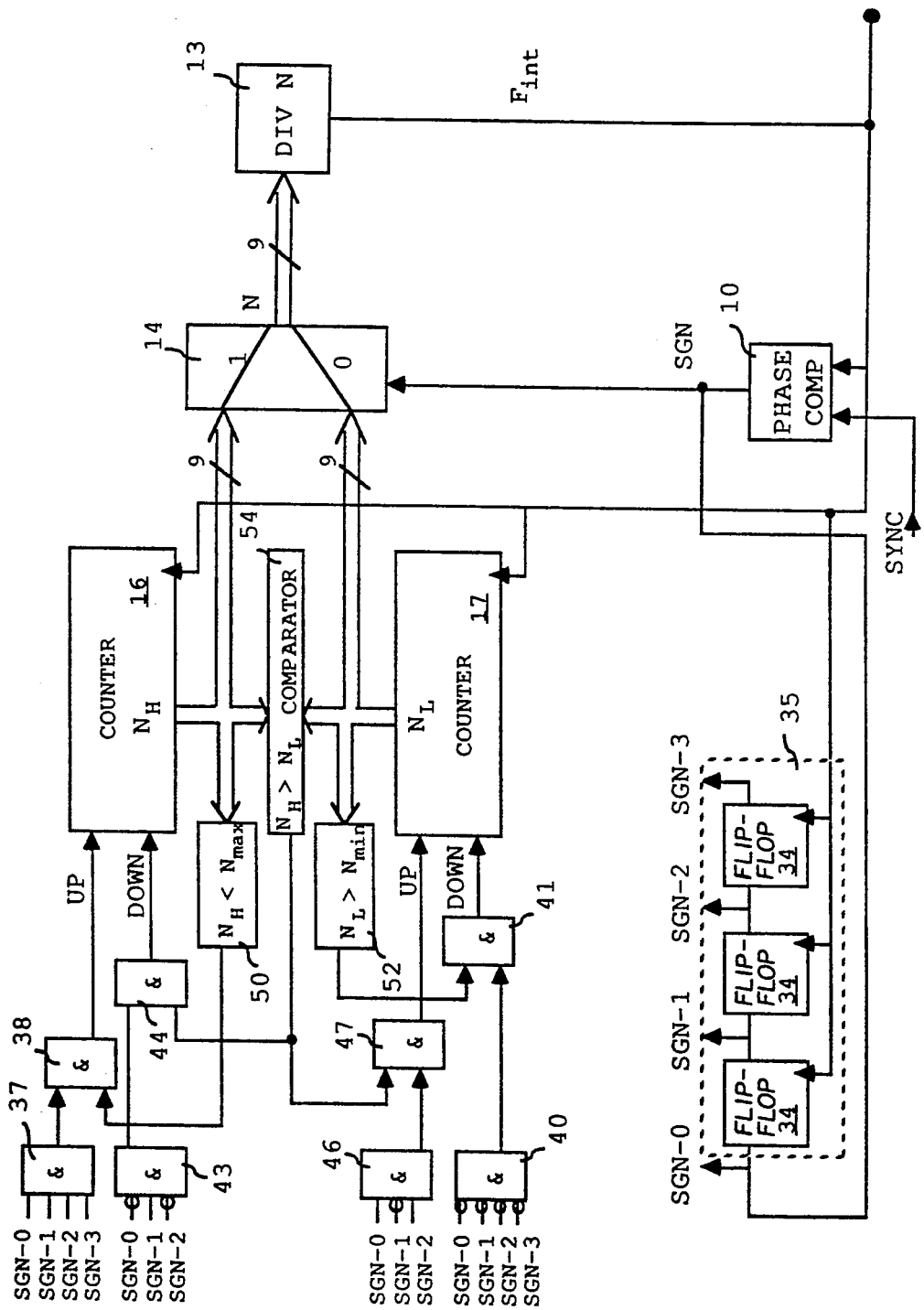
FIG. 3 is an exemplary embodiment of the PLL of FIG. 2.

FIG. 3 describes in detail an embodiment of the PLL of FIG. 2. The figure shows again the phase comparator 10, the multiplexer 14 and the programmable divider 13 of FIG. 2. Memories 16 and 17 containing the high number $N_H$ and low number $N_L$ are up/down counters clocked by signal Fint generated by the programmable divider 13. The additional components described hereunder constitute the control circuit 18 of FIG. 2.

The last three states $SGN_{-1}$, $SGN_{-2}$ and $SGN_{-3}$ of the output signal SGN of the phase comparator 10 are stored in three flip-flops 34 of a shift register 35, $SGN_0$ designating the state of the current signal SGN. Shift register 35 is clocked by signal Fint and constitutes the above mentioned analysis window.

States $SGN_0$ to $SGN_{-3}$ are respectively applied to the inputs of a four-input AND gate 37, the output of which is connected through a two-input AND gate 38 to the up-counting validation input (UP) of the up-/down counter 16.

The complements of states $SGN_0$–$SGN_{-3}$ are applied respectively to the inputs of a four-input AND gate 40, the output of which is connected through a two-input AND gate 41 to the down-counting validation input (DOWN) of up/down counter 17.

The complement of state $SGN_0$, state $SGN_{-1}$ and the complement of state $SGN_{-2}$ are respectively applied to the inputs of a three-input AND gate 43, the output of which is connected through a two-input AND gate 44 to the down-counting validation input (DOWN) of the up/down counter 16.

State $SGN_0$, the complement of state $SGN_{-1}$, and state $SGN_{-2}$ are respectively applied to the inputs of a three-input AND gate 46, the output of which is connected through a two-input AND gate 47 to the up-counting validation input (UP) of the up/down counter 17.

In a first step, the AND gates 38, 41, 44 and 47 and other components of the circuit not yet described will not be taken into account because they do not affect the main operation of the PLL. It is assumed that the outputs of the AND gates 37, 40, 43 and 46 are directly connected to the up and down validation inputs of the up/down counters 16 and 17 and that number $N_H$ is higher than number $N_L$. The operation of the PLL according to the invention is described hereafter in relation with FIG. 3.

Four successive "1's" of signal SGN, which corresponds to the above mentioned cases b) and c), are detected by AND gate 37 which enables up-counting of counter 16 and therefore the incrementation by one unit of number $N_H$ during the next pulse of signal Fint.

Four successive "0's" of signal SGN, which corresponds to cases d) and e) above mentioned, are detected by AND gate 40 which enables down-counting of counter 17 and therefore the decrementation by one unit of number $N_L$ during the next pulse of signal Fint.

A series of states 1, 0, 1 of signal SGN, which corresponds to cases a) and c) above mentioned, is detected by gate 46 which enables the counting of counter 17 and therefore the incrementation of number $N_L$ during the next pulse of signal Fint.

A series of states 0, 1, 0 of signal SGN, which corresponds to cases a) and e) above mentioned, is detected by gate 43 which enables down-counting of counter 16 and therefore the decrementation of number $N_H$ during the next pulse of signal Fint.

The circuit according to the invention comprises additional components among which AND gates 38, 41, 44 and 47, preventing numbers $N_H$ and $N_L$ from having false values, namely high number $N_H > $ Nmax, $N_L < $ Nmin, and $N_H < N_L$. Numbers Nmax and Nmin respectively designate the numbers corresponding to the extreme periods of signal Fint, between which the period of signal SYNC is supposed to vary.

To avoid that counter 16 counts beyond Nmax, its output ($N_H$) is connected to a comparator 50 which compares number $N_H$ with Nmax and inhibits the up counting of counter 16 by presenting a state "0" on the second input of the AND gate 38 when $N_H > $ Nmax.

To avoid that counter 17 counts below Nmin, the output ($N_L$) of the counter is connected to a comparator 52 which compares number $N_L$ with Nmin and inhibits the down counting of counter 17 by presenting a state "0" on the second input of the AND gate 41 when $N_L < $ Nmin.

Numbers $N_H$ and $N_L$ are also compared in a comparator 54 which inhibits the down counting of counter 16 and the up counting of counter 17 by presenting a "0" on the second inputs of AND gates 44 and 47 when $N_H < N_L$.

Numbers $N_H$ and $N_L$ are numbers remaining close to a high number, about 7000 in the practical example that will be described hereafter. Storing high numbers that little vary in counters 16 and 17 is not advantageous because counters with a high number of bits would be necessary. It is preferred to store in counters 16 and 17 intermediate high ($n_H$) and low ($n_L$) numbers comprised between 0 and a number that can be coded on a tolerable number of bits, these numbers being then provided to a specific programmable divider which calculates from these numbers the adequate division factor N.

$N_H$ and $N_L$ could be simply obtained by adding a constant number to $n_H$ and $n_L$.

Figure 4:
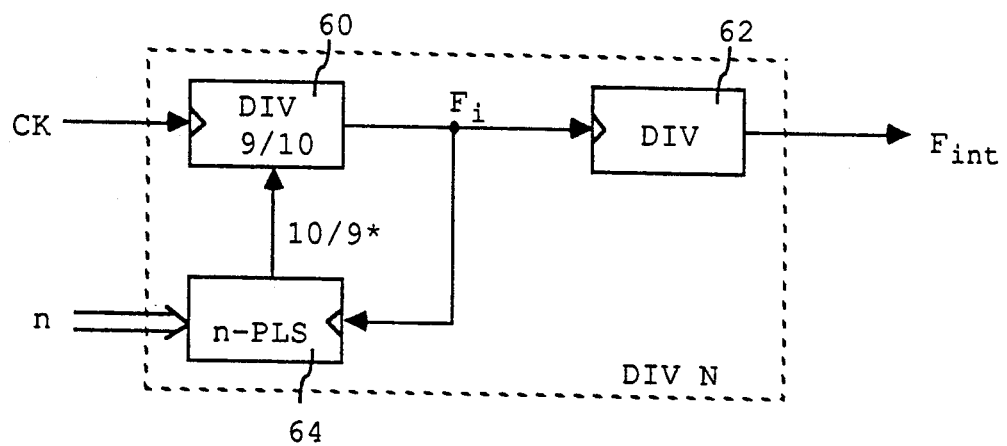
FIG. 4 shows an embodiment of a programmable divider usable in the PLL of FIGS. 2 and 3.

FIG. 4 shows another embodiment of the programmable divider and is intended to show that various modifications can be made to the implementation of the invention. The programmable divider of FIG. 4 comprises a divider by 9 or by 10 (DIV 9/10) 60 receiving the clock signal CK and providing an intermediate signal Fi. The division by 9 (that is, the provision of a pulse every nine pulses of the clock signal CK) or by 10 (that is, the provision of a pulse every ten pulses of signal CK) is selected by a signal 10/9*. State "1" of this signal causes the division by 10 and state "0" causes the division by 9. Signal Fint is obtained from the intermediate signal Fi by dividing the latter by a divider 62.

Signal 10/9* is provided by a programmable pulse generator (n-PLS) 64 receiving the intermediate signal Fi and programmed by a number n which is one of the intermediate numbers $n_H$ and $n_L$ above described provided by the multiplexer 14 (FIGS. 2 and 3). Each time a predetermined number (higher than n) of pulses of the input signal Fi occurs, the pulse generator 64 will have transmitted only n pulses.

In an example adapted to television, the clock signal CK has a 111-MHz frequency, divider 62 is a divider by 768 and the pulse generator 64 is a generator of n pulses amongst 1024 pulses of signal Fi, number n provided by counters 16 or 17 being a binary number (coded on 9 bits) ranging from 0 to 511.

With this divider configuration, signal Fi presents successions of 1024 pulses, n of which are separated one from the other by 10 periods of the clock signal CK and 1024−n of which are separated one from the other by 9 periods of signal CK. Signal Fint presents a pulse every 768 pulses of signal Fi.

Thus, the frequency of signal Fint is equal to that of clock signal CK divided by $N=768[(n/1024)+9]$. If $n=256$, $N=7104$ and the frequency of signal Fint is equal to the rated line frequency of 15625 Hz.

When this divider is used in the PLL according to the invention, as soon as the high ($n_H$) and low ($n_L$) intermediate numbers differ by one unit, the difference between the long period and short period of signal Fint is 6.7 nanoseconds, which corresponds to an imperceptible shift on a TV screen.

In addition, the PLL according to the invention can track a signal SYNC having a period varying from 62.3 to 65.7 microseconds (respectively corresponding to $n_L = 0$ and $n_H = 511$). These extreme periods can be enlarged by using up/down counters and a programmable divider with a higher number of bits, and by decreasing the division factor of divider 62. The minimum difference between short and long periods can be reduced by using a clock signal CK with a higher frequency and by increasing the division factor of divider 62.

In the embodiment described in relation with FIG. 3, a durable advanced or delayed phase of signal Fint is detected over four periods (AND gates 37, 40). The occurrence of an accidental different phase is detected over three periods (AND gates 43, 46). It would also have been possible to achieve a detection over three periods in both cases.

The invention has been described in relation with TV signals, but those skilled in the art will note that this circuit is a digital PLL that can be used instead of any conventional PLL by adapting the frequency of clock CK, the division factors of the dividers and the differences between numbers $N_H$ and $N_L$. Various variants and modifications of the invention will appear to those skilled in the art, for example, the counters, logic gates and dividers can be achieved by properly programming a microprocessor and the shift register 35 can be replaced by memory cells. It is possible to devise other logic circuits having the same functions as those of the described logic circuits.

What is claimed is:

1. A method of synchronizing an internal signal with a reference signal, comprising the steps of:
   a) providing a phase comparison signal having a first logic state when the phase of the internal signal is in advance with respect to the reference signal, and having a second logic state otherwise;
   b) producing the internal signal by dividing a clock signal by a first variable divisor when said phase comparison signal is in said first logic state or a second variable divisor when said phase comparison signal is in said second logic state, the value of said first divisor initially being greater than the value of said second divisor; and
   c) altering the value of said first and second variable divisors based on the value of successive states of said phase comparison signal.

2. The method of claim 1, further including the step of storing a predetermined number of successive states of said phase comparison signal.

3. The method of claim 2 wherein the step of altering the value of said first and second variable divisors alters the value by selectively incrementing or decrementing the value of said first or second variable divisor based on the value of said predetermined number of successive states.

4. The method of claim 3, further including the step of preventing the value of said second divisor from exceeding the value of said first divisor by comparing the value of said first divisor with the value of said second divisor and disabling the decrementing of the value of said first divisor and the incrementing of the value of said second divisor when value of said first divisor equals the value of said second divisor.

5. The method of claim 3, further including the step of preventing the value of said first divisor from exceeding a predetermined maximum first divisor value by comparing the value of said first divisor with the value of said maximum first divisor and disabling the incrementing of the value of said first divisor when the value of said first divisor equals the value of said maximum first divisor.

6. The method of claim 3, further including the step of preventing the value of said second divisor from falling below a predetermined minimum second divisor value by comparing the value of said second divisor with the value of said minimum second divisor and disabling the decrementing of the value of said second divisor when the value of said second divisor equals the value of said minimum second divisor.

7. A method for synchronizing an internal signal with respect to a reference signal having a reference period, said internal signal having a long period or a short period between which said reference period is normally included, comprising the following steps:
   a) analyzing the duration of the reference period with respect to the durations of the long and short periods;
   b) when the reference period is closer to the long period than the short period, incrementing the short period;
   c) when the reference period is closer to the short period than the long period, decrementing the long period;
   d) when the reference period is higher than the long period, incrementing the long period; and
   e) when the reference period is lower than the short period, decrementing the short period.

8. A method according to claim 7, wherein step a) consists in analyzing a predetermined number of the latest successive differences of phase between the internal signal and the reference signal and wherein the requirements of steps b) to e) are met when, respectively:
   the number of phases in advance is higher than the number of lagged phases;
   the number of lagged phases is higher than the number of phases in advance;
   there is no phase lag; and
   there is no phase advance.

9. A method according to claim 8, comprising the following steps:
   when the number of successive phases in advance is higher than a predetermined number, incrementing the long period; and
   when the number of successive phase lags is higher than the predetermined number, decrementing the short period.

10. A method according to claim 7, comprising the following steps:
    comparing the long and short periods; and
    inhibiting the decrementation of the long period and the incrementation of the short period when the difference between these periods is lower than a predetermined threshold.

11. A method according to claim 7, comprising the following steps:
    comparing the long period with a maximum period and inhibiting the incrementation of the long period when said periods are equal; and
    comparing the short period with a minimum period and inhibiting the decrementation of the short period when said periods are equal.

12. A device for synchronizing an internal signal with a reference signal, the device comprising:
    a phase comparator providing a phase comparison signal with a first logic state when the phase of the internal signal is in advance with respect to the reference signal, and a second logic state otherwise;
    a programmable frequency divider producing the internal signal by dividing a clock signal by a first variable divisor when said phase comparison signal is in said first logic state or a second variable divisor when said phase comparison signal is in said second logic state, the value of said first divisor initially being greater than the value of said second divisor; and control means for altering the value of said first and second variable divisor.

13. The device of claim 12, further including storage means for storing a predetermined number of successive states of said phase comparison signal.

14. The device of claim 13 wherein said control means alters the value of said first and second variable divisor by selectively incrementing or decrementing the value of said first or second variable divisor based on the value of said predetermined number of successive states.

15. The device of claim 14, further including means for preventing the value of said second divisor from exceeding the value of said first divisor by comparing the value of said first divisor with the value of said second divisor and disabling the portion of said control means for decrementing the value of said first divisor and incrementing the value of said second divisor when the value of said first divisor equals the value of said second divisor.

16. The device of claim 14, further including means for preventing the value of said first divisor from exceeding a predetermined maximum first divisor value by comparing the value of said first divisor with the value of said maximum first divisor and disabling the portion of said control means for incrementing the value of said first divisor when the value of said first divisor equals the value of said maximum first divisor.

17. The device of claim 14, further including means for preventing the value of said second divisor from falling below a predetermined minimum second divisor value by comparing the value of said second divisor with the value of said minimum second divisor and disabling the portion of said control for decrementing the value of said second divisor when the value of said second divisor equals the value of said minimum second divisor.

18. A device for synchronizing an internal signal with respect to a reference signal, said signals each comprising pulses normally occurring at a rated frequency, comprising:

a phase comparator providing a phase comparison signal at a predetermined logic state when the phase of said internal signal is in advance with respect to the phase of the synchronization signal, and at a complementary logic state otherwise;

a programmable frequency divider fed by a clock and providing said internal signal;

a multiplexer providing to said divider, in order to program it, a high binary number when said phase comparison signal is at said predetermined state, and a low binary number, otherwise;

a means for sequentially storing a predetermined number of the latest states of said phase comparison signal;

a first counting means clocked by said internal signal and providing said high binary number to said multiplexer;

a first detection means setting said first counting means in down-counting position when said predetermined number of latest stored states of said phase comparison signal have a single state at said predetermined state;

a second counting means, clocked by said internal signal and providing said low binary number to said multiplexer; and a second detection means setting said second counting means in up-counting position when said predetermined number of latest stored states of said phase comparison signal have a single state at said complementary state.

19. A device according to claim 18, further including:

a third detection means setting said first counting means in up-counting position when said predetermined number of latest stored states of said phase comparison signal are all at said predetermined state; and a fourth detection means setting said second counting means to down-counting position when said predetermined number of latest stored states of said phase comparison signal are at said complementary state.

20. A device according to claim 19, comprising a first comparator for comparing the high and low binary numbers and setting said first and second counting means in a standby state when the high number is lower than or equal to the low number.

21. A device according to claim 18, comprising:

a second comparator comparing said high binary number with a maximum binary number and setting said first counting means in a standby state when said maximum number is exceeded; and a third comparator comparing said low binary number with a minimum number and setting said second counting means in said standby state when said minimum number is exceeded.

22. A device according to claim 18, wherein said programmable divider comprises a divider by two distinct numbers, either one is selected by the output signal of a pulse generator programmed by the number provided by said multiplexer.

* * * * *

UNITED STATES PATENT AND TRADEMARK OFFICE
CERTIFICATE OF CORRECTION

PATENT NO. : 5,319,681
DATED : June 7, 1994
INVENTOR(S) : Jacques Meyer

It is certified that error appears in the above-identified patent and that said Letters Patent is hereby corrected as shown below:

In claim 4, column 9, line 55, after "when" and before "value", please insert --the--.

In claim 17, column 11, line 38, after "control" and before "for decrementing", please insert --means--.

Signed and Sealed this

Twenty-seventh Day of September, 1994

Attest:

BRUCE LEHMAN

Attesting Officer    Commissioner of Patents and Trademarks